United States Patent [19]
Freuler et al.

[11] Patent Number: 5,300,893
[45] Date of Patent: Apr. 5, 1994

[54] AMPLIFIER

[75] Inventors: George H. Freuler, Moreno Valley; Edward J. Collier, Anaheim; David A. Mazi, Moreno Valley, all of Calif.

[73] Assignee: Zero Impedance Systems, Inc., Yorba Linda, Calif.

[21] Appl. No.: 851,334

[22] Filed: Mar. 16, 1992

[51] Int. Cl.⁵ .................................................. H03G 3/00
[52] U.S. Cl. .......................................... 330/84; 330/146
[58] Field of Search ................... 330/84, 146, 306, 260

[56] References Cited
U.S. PATENT DOCUMENTS

| | | | |
|---|---|---|---|
| 4,398,159 | 8/1983 | Ball et al. | 330/260 |
| 4,560,946 | 12/1985 | Yokoyama | 330/84 |
| 4,577,160 | 3/1986 | Lettvin et al. | 330/257 |
| 4,667,166 | 5/1987 | Itoh | 330/260 |
| 4,721,919 | 1/1988 | LaRosa et al. | 330/146 |
| 5,030,919 | 7/1991 | Freuler et al. | 324/720 |

OTHER PUBLICATIONS

"Handbook of Modern Electronics and Electrical Engineering", Belove, pp. 727 & 728, John Wiley & Sons, 1986.

Primary Examiner—Robert J. Pascal
Assistant Examiner—Tan Dinh
Attorney, Agent, or Firm—Spensley Horn Jubas & Lubitz

[57] ABSTRACT

An amplifier circuit for applying a voltage from a voltage source across a load having a frequency domain transfer function $g(s)$, the circuit being composed of: a coupling member having a frequency domain transfer function $f(s)$; first connecting elements for connecting the coupling member between the source and the load; a compensating member having a frequency domain transfer function $r(s)$; and second connecting elements for connecting the compensating member to both the source and the load.

7 Claims, 2 Drawing Sheets

AMPLIFIER

BACKGROUND OF THE INVENTION

The present invention relates to amplifier circuits for connecting the output terminals of a voltage source across a load impedance.

The operation of many electrical and electronic systems relies on the application of a voltage across a load from a voltage source and it is recognized in the art that the quality of performance of such systems depends on the extent to which the voltage across the load corresponds to, or equals, the open circuit source voltage, or an amplified version of the source voltage.

Ideal coupling would result in appearance of a voltage proportional to the open circuit source voltage across the load. This would cause the signal across the load to have exactly the same time and frequency domain characteristics as the source signal.

However, there is no circuit arrangement which achieves perfect transfer, or ideal coupling, of the source voltage to the load.

Errors in such voltage transfers have two basic causes. Firstly, a practical voltage source behaves like an ideal voltage source in series with a source impedance. Therefore, when current is drawn from such a source, there is a voltage drop across the source resistance. Secondly, the voltage source is connected to the load via a coupling medium which has a finite impedance at any given frequency, and which will therefore be responsible for a further voltage drop.

The achievement of ideal coupling would be advantageous in many electronics systems. For example, if the signal source is an electronic or electrical circuit port, the load is an oscilloscope employed to monitor the time domain waveform of the voltage developed by the signal source and the intervening coupling medium is the oscilloscope probe and associated cabling, the oscilloscope trace will accurately reflect the waveform of the source voltage only if the voltage applied to the oscilloscope inputs is identical to the open circuit source voltage.

For many other types of electronics purposes, ideal coupling would produce optimum results. This would also be the case in a variety of audio, data transmission, communication and telecommunication systems.

It is known to minimize source-to-load voltage drops, or signal attenuation, by the provision of an active circuit, known as an amplifier stage, between the source and load circuits. When such a circuit is used, for example as a unity gain voltage follower, the ratio of load voltage, $V_L$, to source voltage, $V_i$, can be expressed as follows:

$$\frac{V_L}{V_i} = A_V \left( \frac{R_{IN}}{R_{IN} + Z_i} \right) \left( \frac{Z_L}{Z_L + R_{OUT}} \right) \quad (1)$$

Where $A_V$ is the open circuit voltage gain of the amplifier stage, $R_{IN}$ is the driving point input resistance of the amplifier stage, $R_{OUT}$ is the driving point output resistance of the amplifier stage, $Z_i$ is the source impedance, and $Z_L$ is the load impedance.

If $R_{IN}$ is much greater than the absolute value of $Z_i$, the absolute value of $Z_L$ is much greater than $R_{OUT}$, and $A_V$ is approximately equal to 1, the load-to-source voltage ratio will be almost equal to unity. An ideal amplifier will have a value for $R_{IN}$ approaching infinity, a value for $R_{OUT}$ approaching zero and a value for $A_V$ substantially equal to unity.

However, practical amplifiers, when connected as a unity gain voltage follower or buffer, which include bipolar emitter followers and MOSFET source followers, have characteristics which are far from ideal. Emitter followers typically establish driving point input resistances that are rarely larger than a few hundred kΩ and driving point output resistances that are rarely smaller than several tens of Ω. Additionally, their open circuit voltage gains are usually no better than 0.95. MOSFET source followers provide a reasonable approximation of an infinitely large driving point input resistance, but their output resistance can be of the order of 100Ω. Moreover, the low frequency open circuit voltage gain of a MOSFET source follower can be as low as 0.75 and when compared with bipolar emitter followers, the frequency response of a MOSFET source follower is substantially inferior. Both of these types of followers have marginal high frequency response capabilities. In the case of an emitter follower circuit, the frequency response can also be significantly underdamped, which would promote circuit and system instability, particularly when the load is highly capacitive.

It is also known in the art to employ an operational amplifier connected, for example as a voltage follower, to transfer a voltage from one circuit point to another. Known circuits of this type do not approximate ideal coupling.

SUMMARY OF THE INVENTION

It is an object of the present invention to provide an amplifier circuit, one of the uses of which may be as an impedance buffer circuit, which can provide an extremely low attenuation factor between a voltage source and a load.

Another object is to provide a circuit of this type which approximates an ideal coupling medium to a greater degree than prior art amplifier circuits.

A further object of the invention is to provide an amplifier circuit which can achieve near ideal coupling between a source and a load.

Still another object of the invention is to provide an amplifier circuit which achieves near ideal coupling with a structurally simple arrangement of inexpensive components.

Yet another object of the invention is to achieve real time, broadband compensation of any voltage variation and/or current phase shift between a source and a load due to the transfer characteristics of a coupling circuit and/or the transfer characteristics of the transmission line and/or load impedance.

Another object of the invention is to achieve real time, broadband insensitivity to external stimuli which may alter or affect the transfer function of the amplifier circuit and/or the load and any transmission line connected between the load and the amplifier circuit, such external stimuli including stray fields and noise.

Yet a further object of the invention is to achieve a real time, broadband improvement of the amplifier circuit gain/phase margin, in effect compensating for the effect of a pole internal to the amplifier circuit, thereby broadening the usable band width of the amplifier circuit.

Another object of the invention is to achieve real time, broadband insensitivity to amplifier circuit layout, by compensating for stray reactances inherent in the physical layout of the amplifier circuit.

The above and other objects are achieved, according to the invention, by an amplifier circuit for applying a voltage from a voltage source across a load having a complex frequency domain transfer function g(s), the circuit comprising: coupling means having a complex frequency domain transfer function f(s); first connecting means for connecting the coupling means between the source and the load; compensating means having a complex frequency domain transfer function r(s); and second connecting means for connecting the compensating means to both the source and the load.

DESCRIPTION OF THE PREFERRED EMBODIMENTS

Figure 1:
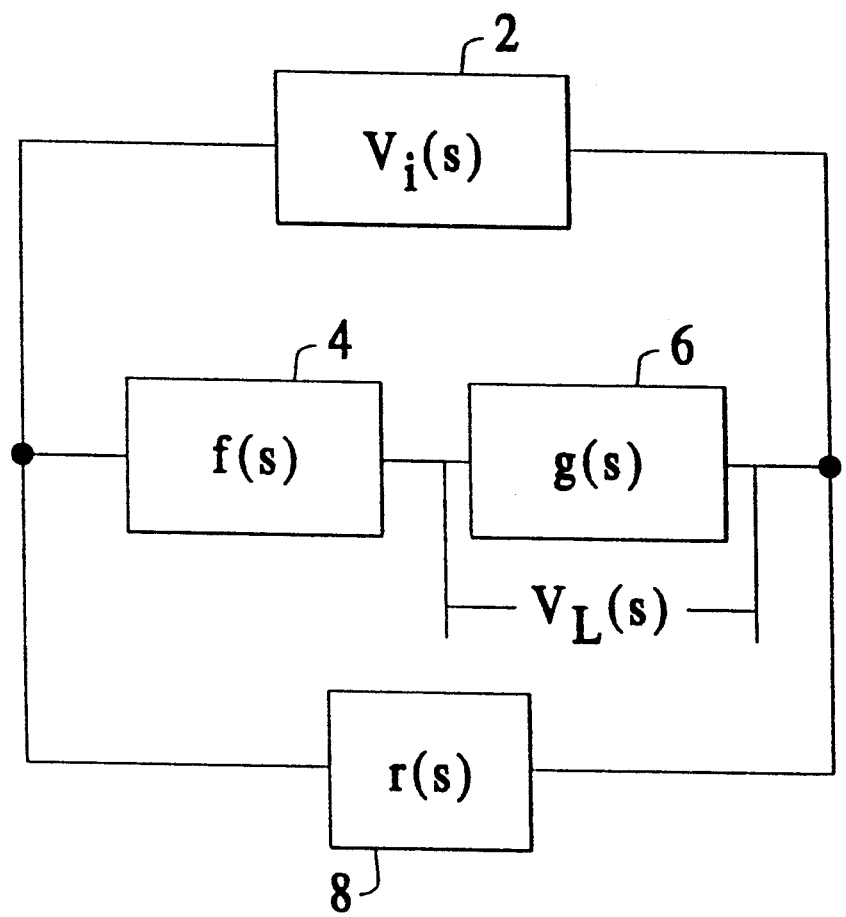
FIG. 1 is a block diagram illustrating a system for providing improved coupling in accordance with the present invention.

FIG. 1 is a block diagram illustrating a system which includes a voltage source 2, a load 6, and circuit components 4 and 8 for coupling the source to the load. Each block is represented by its Fourier transform, or frequency domain, function. Thus, voltage source 2 has the transfer function $V_i(s)$ and load 6 has the transfer function g(s). Conventional arrangements for coupling source 2 to load 6 would be composed of a circuit device as represented by block 4. According to principles known in the art, block 4 would be constructed to cause $V_L(s)$ to have a value as close as possible to $V_i(s)$ and to cause $V_i(s)$ to have a value as close as possible to the open circuit output voltage of source 2. However, it will unavoidably occur that the voltage coupling between source 2 and load 6 will be influenced by transfer functions f(s) and g(s), which will introduce some difference between the open circuit voltage provided by source 2 and $V_L(s)$.

In the prior art, efforts have been made to compensate for such difference by the provision of additional components which are capable of eliminating, or at least substantially reducing, that difference at a defined frequency.

According to the present invention, coupling unit 4 is supplemented by a restoration, or compensation, element or unit 8 having the transfer function r(s), which is capable of substantially completely compensating for the influence of f(s) and g(s) on $V_L(s)$ over a broad frequency band. Specifically, this result will be completely achieved if:

$$r(s) = -[f(s) + g(s)].$$

The extent to which full compensation is approached is dependent on the extent to which complete equality is approached in the above-defined relationship.

Moreover, the signal frequency band over which full compensation is approached is dependent on the operating band widths of units 4 and 8. Accordingly, in preferred embodiments of the invention, unit 8 will be constructed to have an operating band width at least equal to that of unit 4.

Figure 2:
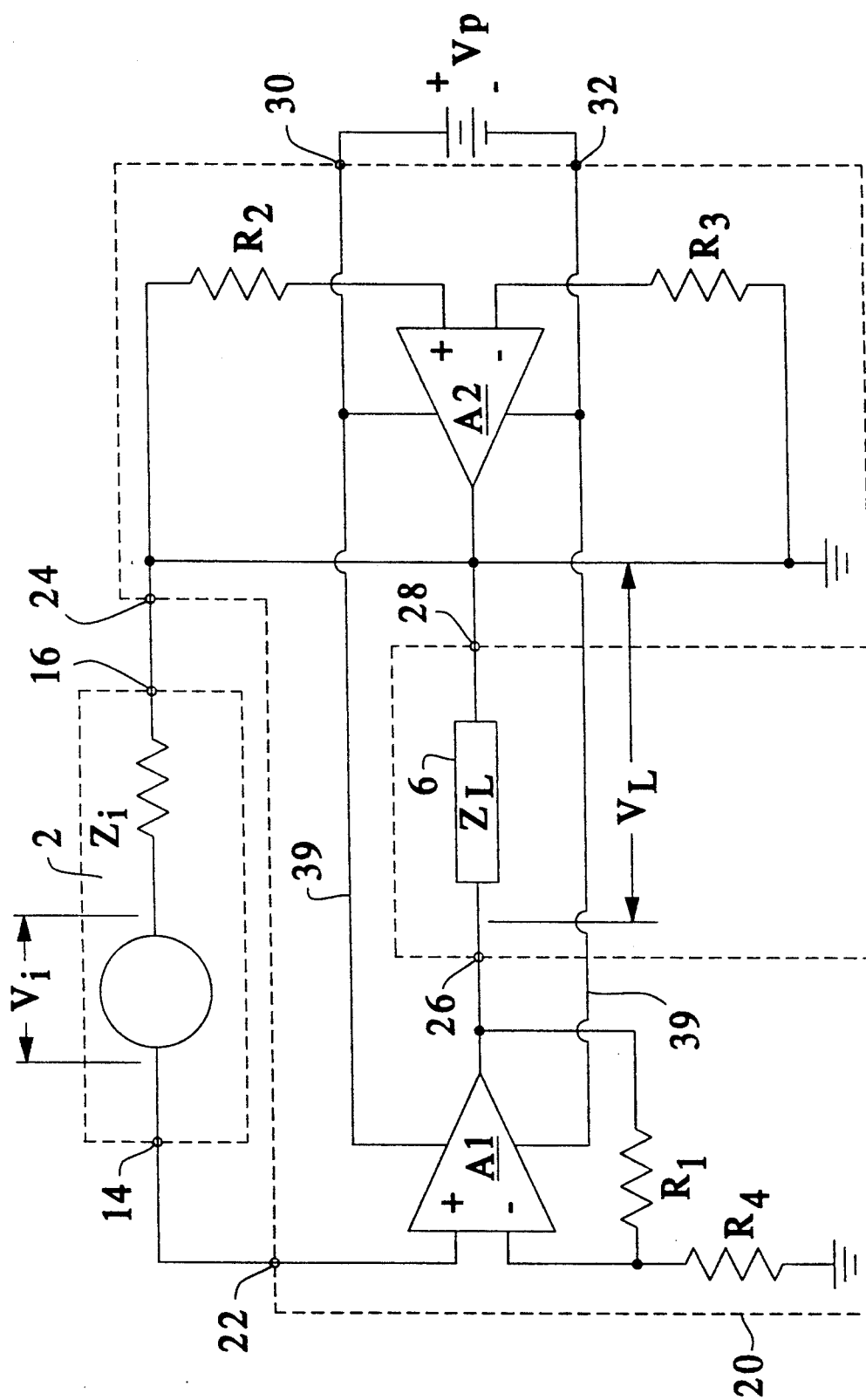
FIG. 2 is a circuit diagram of a circuit containing a preferred embodiment of an amplifier circuit according to the present invention, one of the uses of which may be as a unity gain buffer.

FIG. 2 is a circuit diagram of a preferred embodiment of an amplifier circuit according to the present invention for coupling a voltage source 2 to a load 6 having an impedance $Z_L$ in such a manner that the voltage $V_L$ across load 6 is substantially equal to the open circuit voltage $V_i$ from source 2.

Source 2 has two output terminals 14 and 16, terminal 14 being connectable to the noninverting input of a differential amplifier A1. The output of differential amplifier A1 is connectable to a first end of load 6 and to the inverting input of the same amplifier. In the illustrated embodiment, a feedback resistor $R_1$ is connected between the output of amplifier A1, and thus the first side of load 6, and the inverting input of amplifier A1; and a further resistor $R_4$ is connected between the inverting input of amplifier A1 and a point defining the reference potential for the circuit, here illustrated as ground. Amplifier A1 and resistors $R_1$ and $R_4$ here essentially correspond to device 4 of FIG. 1.

According to a particular novel feature of the invention, the amplifier circuit includes a second differential amplifier A2 whose output is connectable to both terminal 16 of source 2 and the second side of load 6. The noninverting and inverting inputs of amplifier A2 are connected via respective resistances $R_2$ and $R_3$ to the output of amplifier A2. These components essentially constitute unit 8 of FIG. 1.

Both amplifiers, and particularly amplifier A2, are preferably of a type having a high input impedance at each input, a low output impedance and a very high gain, which characteristics are provided by commercially available operational amplifiers.

The amplifier circuit is completed in a manner conventional for operational amplifiers, by a source of operating voltage, $V_p$.

According to preferred embodiments of the invention amplifiers A1 and A2 are mounted in a housing 20 together with resistors $R_1$, $R_2$, $R_3$ and $R_4$, if such resistors are provided, and all of the conductors. The effective gain of amplifier A1, and hence the gain of the amplifier circuit, will be equal to quantity $$\frac{R_1 + R_4}{R_4},$$

or in other words, $$V_L = V_i \times \frac{R_1 + R_4}{R_4}.$$

Therefore, the illustrated circuit can be configured as a unity gain voltage amplifier by making $R_4$ equal to ∞, i.e. by disconnecting the inverting input of amplifier A1 from the point at circuit reference potential. Associated housing 20 carries two input terminals 22 and 24, two output terminals 26 and 28 and two supply voltage terminals 30 and 32 which extend out of housing 20. Input terminal 22 is connected to the noninverting input of amplifier A1 and input terminal 24 is connected to the output of amplifier A2, while each of output terminals 26 and 28 is connected to the output of a respective one of amplifiers A1 and A2. Thus terminals 24 and 28 are shorted together.

Since source 2 is a voltage source, it can conventionally be thought of as a source of an EMF, $V_i$, and a series impedance $Z_i$. The voltage $V_i$ produced by source 2 would have an open-circuit value of $V_i$ and will decrease as the value of the impedance connected between output terminals 14 and 16 decreases. However, with the amplifier circuit according to the present invention, the voltage $V_L$ across load 6 will remain substantially equal to $V_i$, if amplifier A1 is configured as a unity gain voltage follower, nearly independently of the value of $Z_L$.

In an amplifier circuit connected as a unity gain voltage follower according to the invention, the resistance of resistor $R_1$ can have any value between 0 and a very large value. Since the inverting input of amplifier A1 is isolated from ground, there will be virtually no current flow between the output and the inverting input of amplifier A1, so that the output and inverting input will be at the same voltage regardless of the resistance value of resistor $R_1$.

Resistances $R_2$ and $R_3$ will have low values and, according to preferred embodiments, will have resistance values of zero ohms, i.e. both inputs of amplifier A2 are preferably conductively connected to the output of A2. The output of amplifier A2 may be connected to ground, but this is not essential. What is important is that the output of amplifier A2 provide the reference potential for both the source voltage and the load voltage, and a reference point from which to measure circuit performance. When the output of amplifier A2 is not connected to ground, the other side of resistor $R_4$ will be connected to the output of amplifier A2, but will also not be connected to ground.

When source 2 and load 6, as well as the operating voltage source, are connected as shown in FIG. 2, terminal 14 of source 2 is connected to the noninverting input of amplifier A1 and terminal 16 of voltage source 2 is connected to the output of amplifier A2. Thus, amplifier A1 is connected to operate as a voltage follower if $R_4 = \infty$. Load 6 is connected between the outputs of amplifiers A1 and A2.

With the illustrated connection arrangement, it might be thought that amplifier A2 would have no influence on the relation between $V_i$ and $V_L$. However, it has been found that, even when the inputs of amplifier A2 are connected to the output of A2 (the circuit reference point), amplifier A2 has the effect of causing the coupling between $V_i$ and $V_L$ to approach more closely an ideal coupling condition. It is presently believed that amplifier A2 performs a current modulating operation which reduces any phase difference between $V_i$ and $V_L$.

More specifically, amplifier A2, with its associated components, generates, or provides, the complex restoration function $r(s)$, which has the value $-[f(s)+g(s)]$ in the equation $V_i(s) + Af(s) + g(s) + r(s) = V_L(s)$, where $V_i(s)$ and $V_L(s)$ are the frequency domain voltages provided by source 2 and generated across load 6, respectively and A is the amplifier circuit open loop gain determined by $(R_1 + R_4)/R_4$.

Each one of amplifiers A1 and A2 may be a single stage or a multistage operational amplifier. The advantage of using single stage operational amplifiers, as opposed to multistage operational amplifiers, is, in general, broader amplifier and system bandwidth. A single stage configuration also offers the advantages of circuit simplicity, with the attendant reduction in manufacturing problems, and a circuit topology which requires little compensation for broadband operation.

It should be noted that the driving point input resistance of amplifier A1 need not be extremely high to achieve a large system input resistance, given the fact that the inverting input terminal of amplifier A1 may not be returned to ground through a finite impedance if the circuit is configured as a unity gain voltage follower. Thus, the signal source is tied to a subcircuit that is effectively composed of the series combination of the driving point input resistance and, at least at low frequencies, the effective open circuit existing between the amplifier inverting input terminal and ground.

According to other embodiments of the invention, the outputs of amplifiers A1 and A2 can be connected in series with switches for controlling the connection of the output of each differential amplifier A1 and A2 to a respective end of load 6. Such switches may be employed for connecting a plurality of different loads in any desired sequence between the outputs of amplifiers A1 and A2.

Since the value of $V_L$ is virtually independent of the value of $Z_L$, a constant load voltage is produced even when the value of $Z_L$ is varying periodically or intermittently. Moreover, the value of $V_L$ will be the same for any value of $Z_L$ between purely resistive and highly reactive.

To employ an amplifier according to the invention with a grounded source, the ground side of such source could be coupled to terminal 24.

In more general terms, an amplifier circuit according to the present invention is characterized by an input impedance having an extremely high resistance and low capacitance, an extremely low output impedance and a closed circuit voltage gain determined by the ratio $$\frac{R_1 + R_4}{R_4}.$$

While an amplifier circuit according to the invention can be connected to a floating source and a floating ground, and this can prove highly advantageous in certain cases, the amplifier circuit may be connected between a source and a load which are connected to a common ground. It is anticipated that if an amplifier circuit according to the present invention were implemented as a monolithic integrated circuit, the cost of such circuit would be extremely low, frequency related effects will be sharply diminished as input and output capacitances decrease, possibly even into the femtofarad range, operating frequencies will increase into the hundreds of megahertz, input impedances will increase and output impedances will decrease.

A circuit according to the invention has been found to be ideally suited for transferring both analog and digital signals from a signal source to a load, particularly when the load is coupled to the output of one or both amplifiers by a transmission path having a complex transfer function.

The complex function $r(s)$, identified herein as the restoration function, is generated in real time and automatically by the circuit shown in FIG. 2. Furthermore, the real time generation of the complex restoration function $r(s)$ makes the overall amplifier circuit, which performs as a type of complex function generator, insensitive to real time disturbances in the transfer function $f(s)$ of the coupling member and the transfer function $g(s)$ of the load, provided that such disturbances are within the dynamic voltage, current and frequency ranges of the circuit. These ranges constitute what is here identified as the compliance region of a practical embodiment of a circuit according to the present invention.

The operating characteristics of a circuit according to the present invention, particularly in view of the action produced by amplifier A2 and its associated elements, enable the output voltage $V_L$ to be an extremely accurate representation of the voltage $V_i$, whether or not $V_L$ is an amplified version of $V_i$. In other words, the autocorrelation of $V_i(s)$ to $V_L(s)$ will approach an optimum value, virtually independently of the selected circuit gain or any amplifier circuit and transmission line propagation delays which exist.

A circuit according to the invention may be employed in virtually any type of electronics system, including analog and digital communication systems, analog and digital process control systems, navigation systems, radar systems, medical monitoring systems, etc. Examples of communication systems include broadcast systems, video systems, telephone networks, microwave transmission systems, satellite communication systems, etc. In any system of the type mentioned above, any amplifier stage or buffer stage may be constituted by an embodiment of a circuit according to the present invention.

Moreover, it presently appears that unit 4 of FIG. 1 could be constituted by a type of amplifier different from that illustrated in FIG. 2.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. An amplifier circuit for coupling a voltage source to a load, the load having a frequency domain transfer function g(s), said circuit comprising: coupling means having a frequency domain transfer function f(s); first connecting means for connecting said coupling means between the source and the load; compensating means having a frequency domain transfer function r(s); and second connecting means for connecting said compensating means to both the source and the load; wherein: the voltage source has first and second output terminals and the load has first and second ends; said coupling means comprise differential amplifying means having first and second inputs, an output and means for generating a voltage at said output which is proportional to the difference in potential at said first and second inputs, said first input being connected to said first connecting means for connection to the first output terminal of the source, said output being connected to said first connecting means for connection to the first end of the load, and said second input being connected to said output; and said compensating means comprise second amplifying means having at least one input, an output and means for establishing a high voltage gain between said input and said output, said output of said second amplifying means being connected to said second connecting means for connection to the second output terminal of the source and to the second end of the load, and said input of said second amplifying means being connected to said output of said second amplifying means by a circuit connection which maintains the potential at said input of said second amplifying means substantially equal to the potential at said output of said second amplifying means.

2. A circuit as defined in claim 1 wherein said differential amplifying means is a high gain operational amplifier having a noninverting input constituting said first input and an inverting input constituting said second input.

3. A circuit as defined in claim 2 in combination with a voltage source having first and second output terminals, said first output terminal being connected to said noninverting input of said operational amplifier and said second output terminal being connected to said output of said second amplifying means, and a load impedance having first and second ends each connected to the output of a respective one of said amplifying means.

4. A circuit as defined in claim 2 wherein said coupling means further comprise a first resistor connected in series between said output and said inverting input of said operational amplifier and a second resistor connected in series between said inverting input of said operational amplifier and said output of said second amplifying means, whereby the effective gain of said operational amplifier is determined by the ratio of the sum of the resistances of said first and second resistors to the resistance of said second resistor.

5. A circuit as defined in claim 1, further comprising: a housing containing said differential and second amplifying means; first and second input terminals extending out of said housing, said first input terminal being connected to said one input of said differential amplifying means and said second input terminal being connected to said output of said second amplifying means; and first and second output terminals extending out of said housing, each said output terminal of said circuit being connected to said output of a respective one of said amplifying means.

6. A circuit as defined in claim 1 wherein each said amplifying means has an operating bandwidth, the operating bandwidth of said second amplifying means is at least as large as that of said differential amplifying means.

7. A circuit as defined in claim 1 wherein said input of said second amplifying means is connected to said second connecting means for maintaining said input of said second amplifying means at the same electric potential as the second output terminal of the source.

* * * * *